United States Patent
Chiron

(10) Patent No.: US 9,203,353 B2
(45) Date of Patent: Dec. 1, 2015

(54) NOISE CONVERSION GAIN LIMITED RF POWER AMPLIFIER

(71) Applicant: RF Micro Devices, Inc., Greensboro, NC (US)

(72) Inventor: Jean-Frederic Chiron, Tournefeuille (FR)

(73) Assignee: RF Micro Devices, Inc., Greensboro, NC (US)

( * ) Notice: Subject to any disclaimer, the term of this patent is extended or adjusted under 35 U.S.C. 154(b) by 13 days.

(21) Appl. No.: 14/212,154

(22) Filed: Mar. 14, 2014

(65) Prior Publication Data

US 2014/0266427 A1 Sep. 18, 2014

Related U.S. Application Data

(60) Provisional application No. 61/783,897, filed on Mar. 14, 2013.

(51) Int. Cl.
| | |
|---|---|
| *H01Q 11/12* | (2006.01) |
| *H04B 1/04* | (2006.01) |
| *H03G 3/20* | (2006.01) |
| *H03F 1/26* | (2006.01) |
| *H03F 3/189* | (2006.01) |
| *H03F 3/20* | (2006.01) |
| *H03F 1/02* | (2006.01) |

(52) U.S. Cl.
CPC ............. *H03F 1/26* (2013.01); *H03F 1/0222* (2013.01); *H03F 1/0266* (2013.01); *H03F 3/189* (2013.01); *H03F 3/20* (2013.01)

(58) Field of Classification Search
CPC ............. H03F 1/0211; H03F 2200/24; H03F 2200/27; H03F 2200/451; H03F 2200/504; H03F 2200/555; H03F 2200/78; H03F 3/20; H03F 3/189
USPC ......... 455/115.1, 127.1, 127.2; 330/127, 129, 330/285, 296, 297
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |

(Continued)

FOREIGN PATENT DOCUMENTS

| | | |
|---|---|---|
| CN | 1211355 A | 3/1999 |
| CN | 1518209 A | 8/2004 |

(Continued)

OTHER PUBLICATIONS

Notice of Allowance for U.S. Appl. No. 14/072,140, mailed Dec. 2, 2014, 8 pages.

(Continued)

*Primary Examiner* — Quochien B Vuong
(74) *Attorney, Agent, or Firm* — Withrow & Terranova, P.L.L.C.

(57) ABSTRACT

A radio frequency (RF) power amplifier (PA) and an envelope tracking power supply are disclosed. The RF PA receives and amplifies an RF input signal to provide an RF transmit signal using an envelope power supply voltage. The envelope tracking power supply provides the envelope power supply voltage based on a setpoint, which has been constrained so as to limit a noise conversion gain (NCG) of the RF PA to not exceed a target NCG.

26 Claims, 12 Drawing Sheets

(56) References Cited

U.S. PATENT DOCUMENTS

| | | |
|---|---|---|
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 * | 7/2010 | Wilson ........................ 323/361 |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Vinayak et al. |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Witchard |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,717,100 B2 | 5/2014 | Reisner et al. |
| 8,718,579 B2 | 5/2014 | Drogi et al. |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,803,605 B2 | 8/2014 | Fowers et al. |
| 8,824,978 B2 | 9/2014 | Briffa et al. |

(56) References Cited

U.S. PATENT DOCUMENTS

| | | |
|---|---|---|
| 8,829,993 B2 | 9/2014 | Briffa et al. |
| 8,884,696 B2 | 11/2014 | Langer |
| 8,909,175 B1 | 12/2014 | McCallister |
| 8,942,651 B2 * | 1/2015 | Jones .................. 455/127.1 |
| 8,947,162 B2 * | 2/2015 | Wimpenny et al. .......... 330/127 |
| 8,981,847 B2 | 3/2015 | Balteanu |
| 8,994,345 B2 | 3/2015 | Wilson |
| 9,077,405 B2 * | 7/2015 | Jones et al. .................. 1/1 |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1 | 8/2007 | Drogi et al. |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0147445 A1 | 6/2013 | Levesque et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |

(56) References Cited

U.S. PATENT DOCUMENTS

| | | | |
|---|---|---|---|
| 2014/0103995 | A1 | 4/2014 | Langer |
| 2014/0184335 | A1 | 7/2014 | Nobbe et al. |

FOREIGN PATENT DOCUMENTS

| | | | |
|---|---|---|---|
| CN | 1898860 | A | 1/2007 |
| CN | 101201891 | A | 6/2008 |
| CN | 101379695 | A | 3/2009 |
| CN | 101416385 | A | 4/2009 |
| CN | 101427459 | A | 5/2009 |
| CN | 101626355 | A | 1/2010 |
| CN | 101635697 | A | 1/2010 |
| CN | 101867284 | A | 10/2010 |
| EP | 0755121 | A2 | 1/1997 |
| EP | 1317105 | A1 | 6/2003 |
| EP | 1492227 | A1 | 12/2004 |
| EP | 1557955 | A1 | 7/2005 |
| EP | 1569330 | A1 | 8/2005 |
| EP | 2214304 | A1 | 8/2010 |
| EP | 2244366 | A1 | 10/2010 |
| EP | 2372904 | A1 | 10/2011 |
| EP | 2579456 | A1 | 4/2013 |
| GB | 2398648 | A | 8/2004 |
| GB | 2462204 | A | 2/2010 |
| GB | 2465552 | A | 5/2010 |
| GB | 2484475 | A | 4/2012 |
| TW | 461168 | B | 10/2001 |
| WO | 0048306 | A1 | 8/2000 |
| WO | 2004002006 | A1 | 12/2003 |
| WO | 2004082135 | A2 | 9/2004 |
| WO | 2005013084 | A2 | 2/2005 |
| WO | 2006021774 | A1 | 3/2006 |
| WO | 2006070319 | A1 | 7/2006 |
| WO | 2006073208 | A1 | 7/2006 |
| WO | 2007107919 | A1 | 9/2007 |
| WO | 2007149346 | A2 | 12/2007 |
| WO | 2012151594 | A2 | 11/2012 |
| WO | 2012172544 | A1 | 12/2012 |

OTHER PUBLICATIONS

First Office Action for Chinese Patent Application No. 201280026559.0, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
Notice of Allowance for U.S. Appl. No. 13/948,291, mailed Feb. 11, 2015, 7 pages.
First Office Action for Chinese Patent Application No. 201180030273.5, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US2013/052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
European Search Report for European Patent Application No. 14190851.7, issued Mar. 5, 2015, 6 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.

(56) References Cited

OTHER PUBLICATIONS

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20-Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.
Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.
Extended European Search Report for application 06740532.4, mailed Dec. 27, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.

(56) References Cited

OTHER PUBLICATIONS

Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Corrected Notice of Allowance for U.S. Appl. No. 13/297,470, mailed Jun. 5, 2015, 11 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
European Examination Report for European Patent Application No. 14162682.0, mailed May 22, 2015, 5 pages.
International Preliminary Report on Patentability for PCT/US2013/065403, mailed Apr. 30, 2015, 8 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.

(56) References Cited

OTHER PUBLICATIONS

Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,199, mailed Jul. 20, 2015, 8 pages.
Notice of Allowance for U.S. Appl. No. 14/072,120, mailed Jul. 30, 2015, 7 pages.
Notice of Allowance for U.S. Appl. No. 13/689,940, mailed Aug. 3, 2015, 6 pages.
Notice of Allowance for U.S. Appl. No. 14/072,140, mailed Aug. 20, 2015, 6 pages.
Non-Final Office Action for U.S. Appl. No. 14/072,225, mailed Aug. 18, 2015, 4 pages.
Notice of Allowance for U.S. Appl. No. 13/747,725, mailed Sep. 1, 2015, 9 pages.
Notice of Allowance for U.S. Appl. No. 14/027,416, mailed Aug. 11, 2015, 9 pages.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 13/747,749, mailed Oct. 2, 2015, 8 pages.
Notice of Allowance for U.S. Appl. No. 13/552,768, mailed Sep. 22, 2015, 9 pages.
Final Office Action for U.S. Appl. No. 13/689,922, mailed Oct. 6, 2015, 20 pages.
Notice of Allowance for U.S. Appl. No. 13/727,911, mailed Sep. 14, 2015, 8 pages.
Notice of Allowance for U.S. Appl. No. 13/689,940, mailed Sep. 16, 2015, 7 pages.
Non-Final Office Action for U.S. Appl. No. 14/101,770, mailed Sep. 21, 2015, 5 pages.
Non-Final Office Action for U.S. Appl. No. 14/702,192, mailed Oct. 7, 2015, 7 pages.
Non-Final Office Action for U.S. Appl. No. 14/254,215, mailed Oct. 15, 2015, 5 pages.
Second Office Action for Chinese Patent Application No. 201180030273.5, issued Aug. 14, 2015, 8 pages.
International Preliminary Report on Patentability for PCT/US2014/028089, mailed Sep. 24, 2015, 8 pages.
International Preliminary Report on Patentability for PCT/US2014/028178, mailed Sep. 24, 2015, 11 pages.

* cited by examiner

NOISE CONVERSION GAIN LIMITED RF POWER AMPLIFIER

RELATED APPLICATIONS

This application claims the benefit of U.S. provisional patent application No. 61/783,897, filed Mar. 14, 2013, the disclosure of which is incorporated herein by reference in its entirety.

FIELD OF THE DISCLOSURE

Embodiments of the present disclosure relate to envelope tracking power supplies and radio frequency (RF) power amplifiers, either of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, noise limitations, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

A radio frequency (RF) power amplifier (PA) and an envelope tracking power supply are disclosed according to one embodiment of the present disclosure. The RF PA receives and amplifies an RF input signal to provide an RF transmit signal using an envelope power supply voltage. The envelope tracking power supply provides the envelope power supply voltage based on a setpoint, which has been constrained so as to limit a noise conversion gain (NCG) of the RF PA to not exceed a target NCG.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

An RF PA and an envelope tracking power supply are disclosed according to one embodiment of the present disclosure. The RF PA receives and amplifies an RF input signal to provide an RF transmit signal using an envelope power supply voltage. The envelope tracking power supply provides the envelope power supply voltage based on a setpoint, which has been constrained so as to limit a noise conversion gain (NCG) of the RF PA to not exceed a target NCG.

Figure 1:
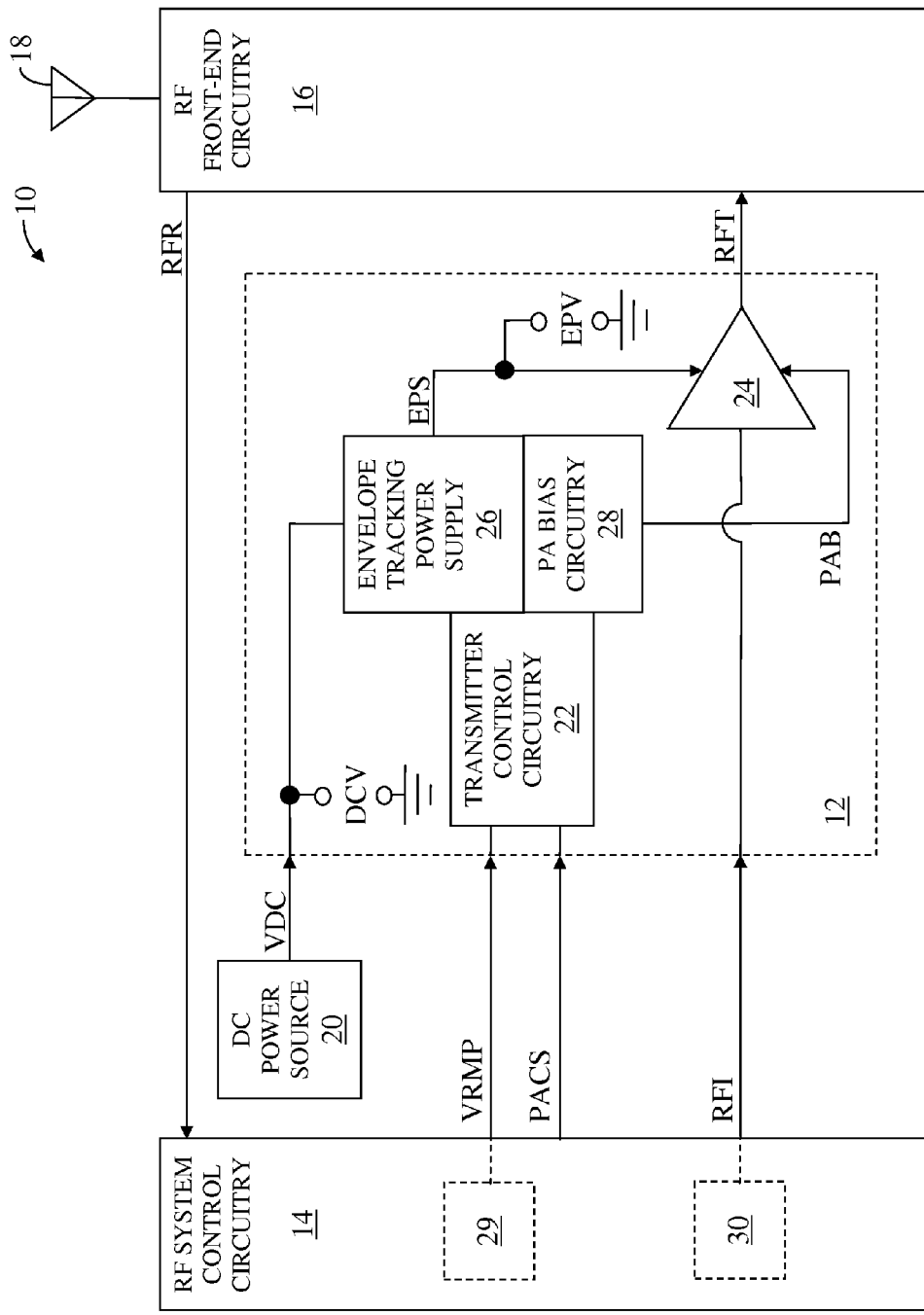
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28. The RF system control circuitry 14 includes envelope control circuitry 29 and an RF modulator 30.

In one embodiment of the RF communications system 10, the RF front-end circuitry 16 receives via the RF antenna 18, processes, and forwards an RF receive signal RFR to the RF system control circuitry 14. In general, the RF system control circuitry 14 provides an envelope power supply control signal VRMP and a transmitter configuration signal PACS to the transmitter control circuitry 22. Further, the RF system control circuitry 14 provides an RF input signal RFI to the RF PA 24. Specifically, the envelope control circuitry 29 provides the envelope power supply control signal VRMP and the RF modulator 30 provides the RF input signal RFI. The DC power source 20 provides a DC source signal VDC to the envelope tracking power supply 26. The DC source signal VDC has a DC source voltage DCV. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The envelope power supply signal EPS has an envelope power supply voltage EPV. The DC source signal VDC provides power to the envelope tracking power supply 26. As such, the envelope power supply signal EPS is based on the DC source signal VDC. The envelope power supply control signal VRMP is representative of a setpoint of the envelope power supply voltage EPV. The setpoint of the envelope power supply voltage EPV is a desired magnitude of the envelope power supply voltage EPV that the envelope tracking power supply 26 endeavors to reach.

In this regard, the envelope tracking power supply 26 provides the envelope power supply voltage EPV based on the setpoint of the envelope power supply voltage EPV. The RF PA 24 receives and amplifies the RF input signal RFI to provide an RF transmit signal RFT using the envelope power supply voltage EPV. The envelope power supply voltage EPV provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, the like, or any combination thereof. In one embodiment of the RF system control circuitry 14, the RF system control circuitry 14 is RF transceiver circuitry, which may include the envelope control circuitry 29, the RF modulator 30, an RF transceiver IC, baseband controller circuitry, the like, or any combination thereof.

Figure 2:
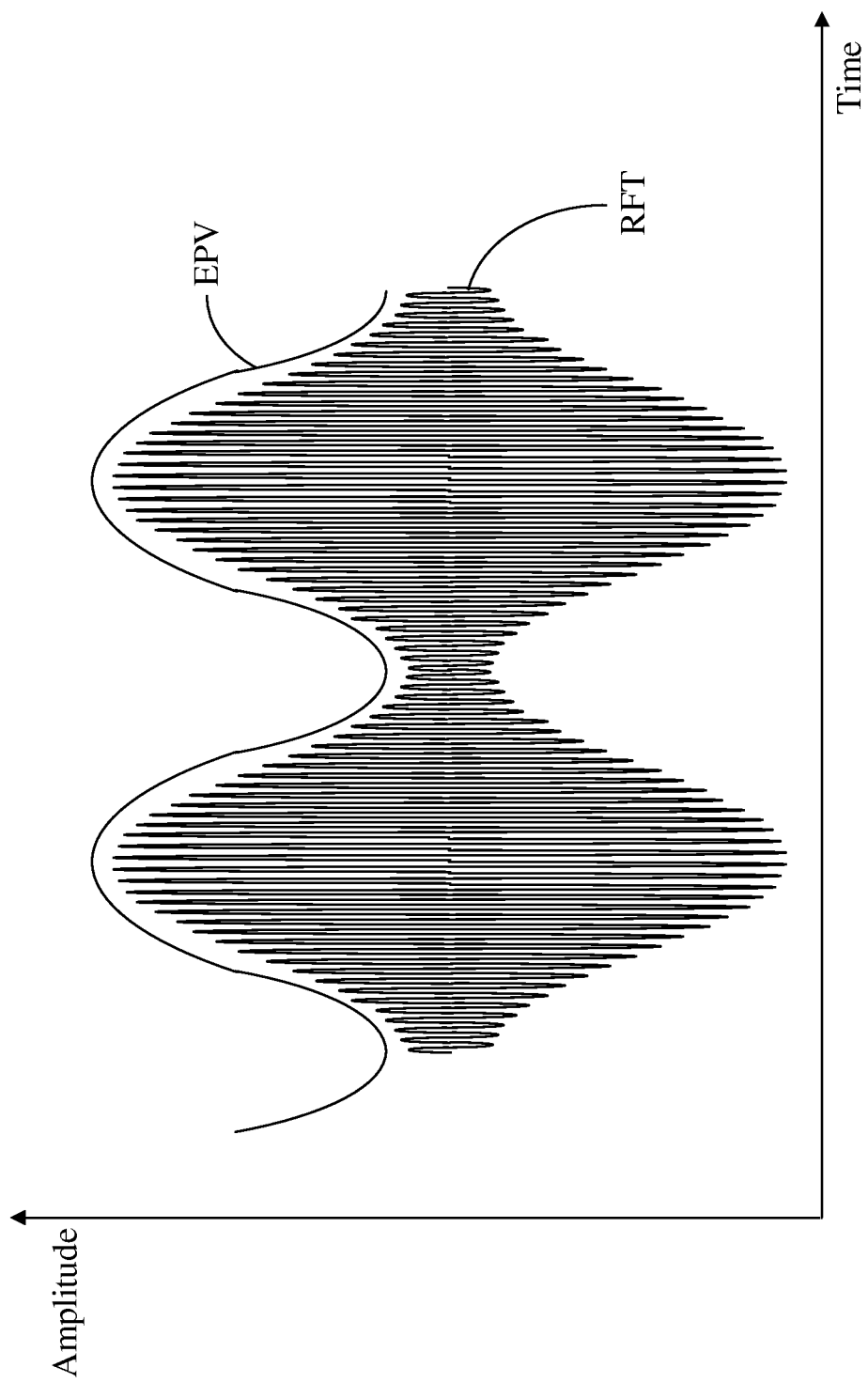
FIG. 2 is a graph illustrating an RF transmit signal and an envelope power supply voltage shown in FIG. 1 according to one embodiment of the RF transmit signal and the envelope power supply voltage.

FIG. 2 is a graph illustrating the RF transmit signal RFT and the envelope power supply voltage EPV shown in FIG. 1 according to one embodiment of the RF transmit signal RFT and the envelope power supply voltage EPV. In one embodiment of the RF input signal RFI (FIG. 1), the RF input signal RFI (FIG. 1) is amplitude modulated. As such, the RF transmit signal RFT is also amplitude modulated, as illustrated in FIG. 2. Since the amplitude of the RF transmit signal RFT is modulated, the amplitude of the RF transmit signal RFT traverses within an envelope of the RF transmit signal RFT. For proper operation of the RF PA 24 (FIG. 1), the envelope power supply voltage EPV must be high enough to accommodate the envelope of the RF transmit signal RFT. However, to increase efficiency in the RF PA 24 (FIG. 1), the envelope power supply voltage EPV at least partially tracks the envelope of the RF transmit signal RFT as illustrated in FIG. 2. This tracking by the envelope power supply voltage EPV is called envelope tracking.

In this regard, in one embodiment of the envelope power supply control signal VRMP (FIG. 1), since the envelope power supply control signal VRMP (FIG. 1) is representative of the setpoint of the envelope power supply voltage EPV, the envelope power supply control signal VRMP (FIG. 1) is amplitude modulated to provide at least partial envelope tracking of the RF transmit signal RFT by causing the envelope power supply voltage EPV to be amplitude modulated.

In one embodiment, of the RF communications system 10 illustrated in FIG. 1, the setpoint of the envelope power supply voltage EPV has been constrained to limit a noise conversion gain (NCG) of the RF PA 24 to not exceed a target NCG. As such, the setpoint of the envelope power supply voltage EPV that has been constrained is a constrained setpoint. The NCG of the RF PA 24 is a metric of how the RF PA 24 converts noise in the envelope power supply voltage EPV to noise in the RF transmit signal RFT. As such, the NCG is a function of both the input power PIN and the envelope power supply voltage EPV.

In one embodiment of the RF communications system 10, a parameterized relationship between the input power PIN and the envelope power supply voltage EPV is used to provide the constrained setpoint to limit the NCG of the RF PA 24 to not exceed the target NCG. Limiting the NCG of the RF PA 24 may provide consistent part-to-part RF performance of the RF PA 24. Therefore, in addition to limiting the NCG of the RF PA 24 to not exceed the target NCG, the parameterized relationship may be used to optimize other RF parameters of the RF PA 24. As such, in a first embodiment of the parameterized relationship, the constrained setpoint is pre-distorted to increase linearity of the RF PA 24. In a second embodiment of the parameterized relationship, the constrained setpoint is pre-distorted to decrease intermodulation distortion of the RF PA 24. In a third embodiment of the parameterized relationship, the constrained setpoint is pre-distorted to maintain approximately constant voltage gain of the RF PA 24. In addition, the parameterized relationship may also be used to provide a secondary criterion. For example, in the third embodiment of the parameterized relationship, the constrained setpoint is pre-distorted to maintain approximately constant voltage gain of the RF PA 24 and the constrained setpoint is further pre-distorted to a specific target voltage gain of the RF PA 24.

In one embodiment of the parameterized relationship, the parameterized relationship is represented by at least one mathematical equation. In an alternate embodiment of the parameterized relationship, the parameterized relationship is represented by at least one look-up table (LUT). In another embodiment of the parameterized relationship, the parameterized relationship is represented by at least one mathematical equation and at least one LUT.

In a first embodiment of the RF communications system 10, the RF system control circuitry 14 constrains the setpoint of the envelope power supply voltage EPV, such that the envelope power supply control signal VRMP is representative of the constrained setpoint of the envelope power supply voltage EPV. In one embodiment of the RF system control circuitry 14, the RF system control circuitry 14 provides the parameterized relationship between the input power PIN and the envelope power supply voltage EPV. As such, the RF system control circuitry 14 pre-distorts the constrained setpoint to optimize the other RF parameters of the RF PA 24, as mentioned above.

In one embodiment of the RF system control circuitry 14, the RF system control circuitry 14 is RF transceiver circuitry. In this regard, the RF transceiver circuitry provides the constrained setpoint of the envelope power supply voltage EPV to the envelope tracking power supply 26 via the envelope power supply control signal VRMP. Further, the RF transceiver circuitry may pre-distort the constrained setpoint to optimize the other RF parameters of the RF PA 24, as mentioned above.

In a second embodiment of the RF communications system 10, the transmitter control circuitry 22 constrains the setpoint of the envelope power supply voltage EPV after receiving the envelope power supply control signal VRMP from the RF system control circuitry 14. In one embodiment of the transmitter control circuitry 22, the transmitter control circuitry 22 provides the parameterized relationship between the input power PIN and the envelope power supply voltage EPV. As such, the transmitter control circuitry 22 pre-distorts the constrained setpoint to optimize the other RF parameters of the RF PA 24, as mentioned above.

In this regard, the envelope power supply control signal VRMP is representative of the setpoint of the envelope power supply voltage EPV before any NCG noise constraints or pre-distortions have been applied. In this regard, the transmitter control circuitry 22 provides the constrained setpoint of the envelope power supply voltage EPV to the envelope tracking power supply 26. As such, the RF system control circuitry 14 provides an unconstrained setpoint of the envelope power supply voltage EPV to the transmitter control circuitry 22 via the envelope power supply control signal VRMP, and the transmitter control circuitry 22 constrains the setpoint of the envelope power supply voltage EPV using the envelope power supply control signal VRMP.

In a third embodiment of the RF communications system 10, the RF system control circuitry 14 partially constrains the setpoint of the envelope power supply voltage EPV, such that the envelope power supply control signal VRMP is representative of a partially constrained setpoint of the envelope power supply voltage EPV, and the transmitter control circuitry 22 partially constrains the setpoint of the envelope power supply voltage EPV after receiving the envelope power supply control signal VRMP.

Figure 3:
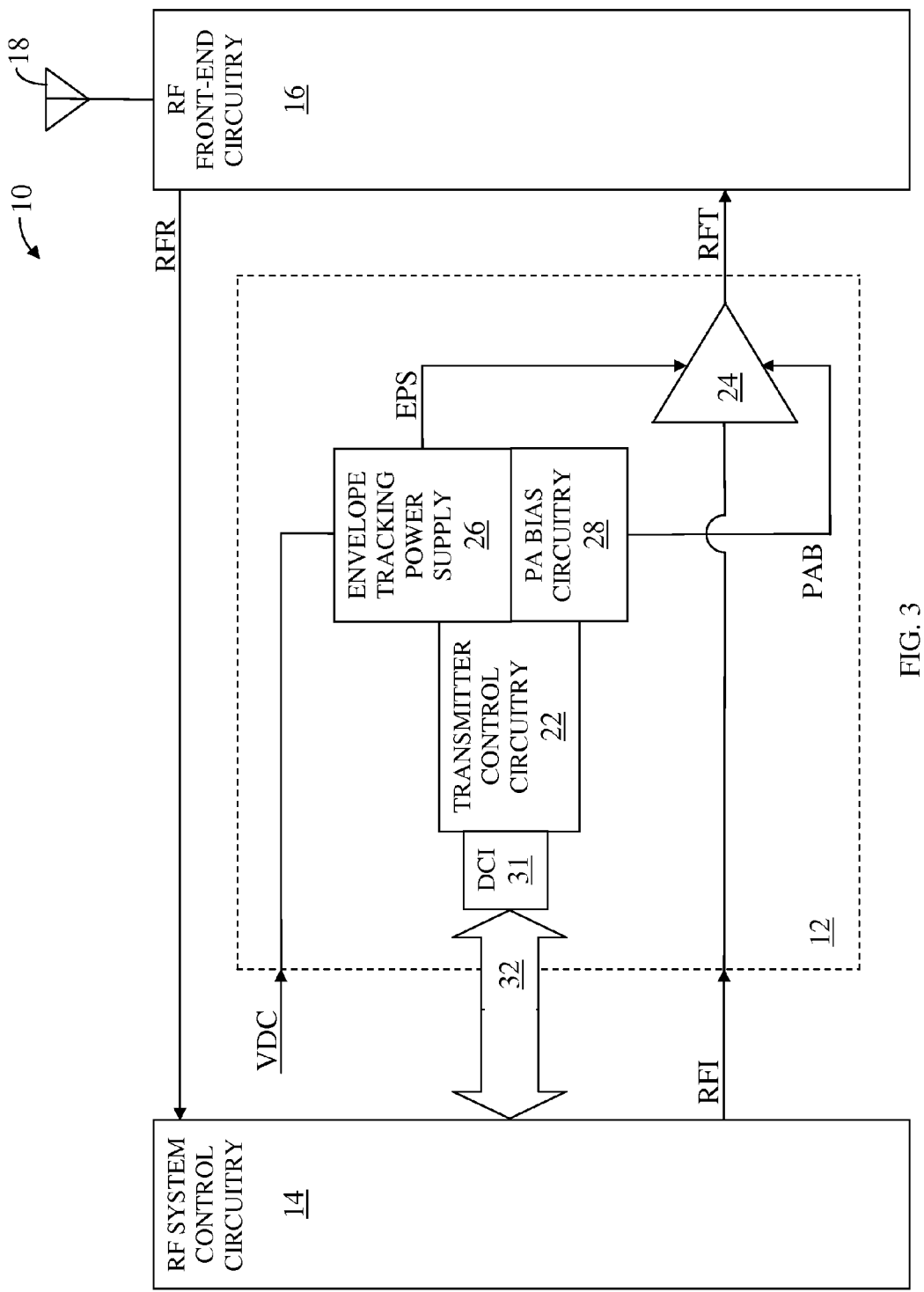
FIG. 3 shows the RF communications system according to an alternate embodiment of the RF communications system.

FIG. 3 shows the RF communications system 10 according to an alternate embodiment of the RF communications system 10. The RF communications system 10 illustrated in FIG. 3 is similar to the RF communications system 10 illustrated in FIG. 1, except in the RF communications system 10 illustrated in FIG. 3, the RF transmitter circuitry 12 further includes a digital communications interface 31, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 31.

In one embodiment of the RF communications system 10, the RF system control circuitry 14 is the RF transceiver circuitry, which provides the constrained setpoint of the envelope power supply voltage EPV to the envelope tracking power supply 26 via the envelope power supply control signal VRMP. Further, the RF transceiver circuitry provides the envelope power supply control signal VRMP (FIG. 1) and the transmitter configuration signal PACS (FIG. 1) to the transmitter control circuitry 22 via the digital communications bus 32 and the digital communications interface 31.

Figure 4:
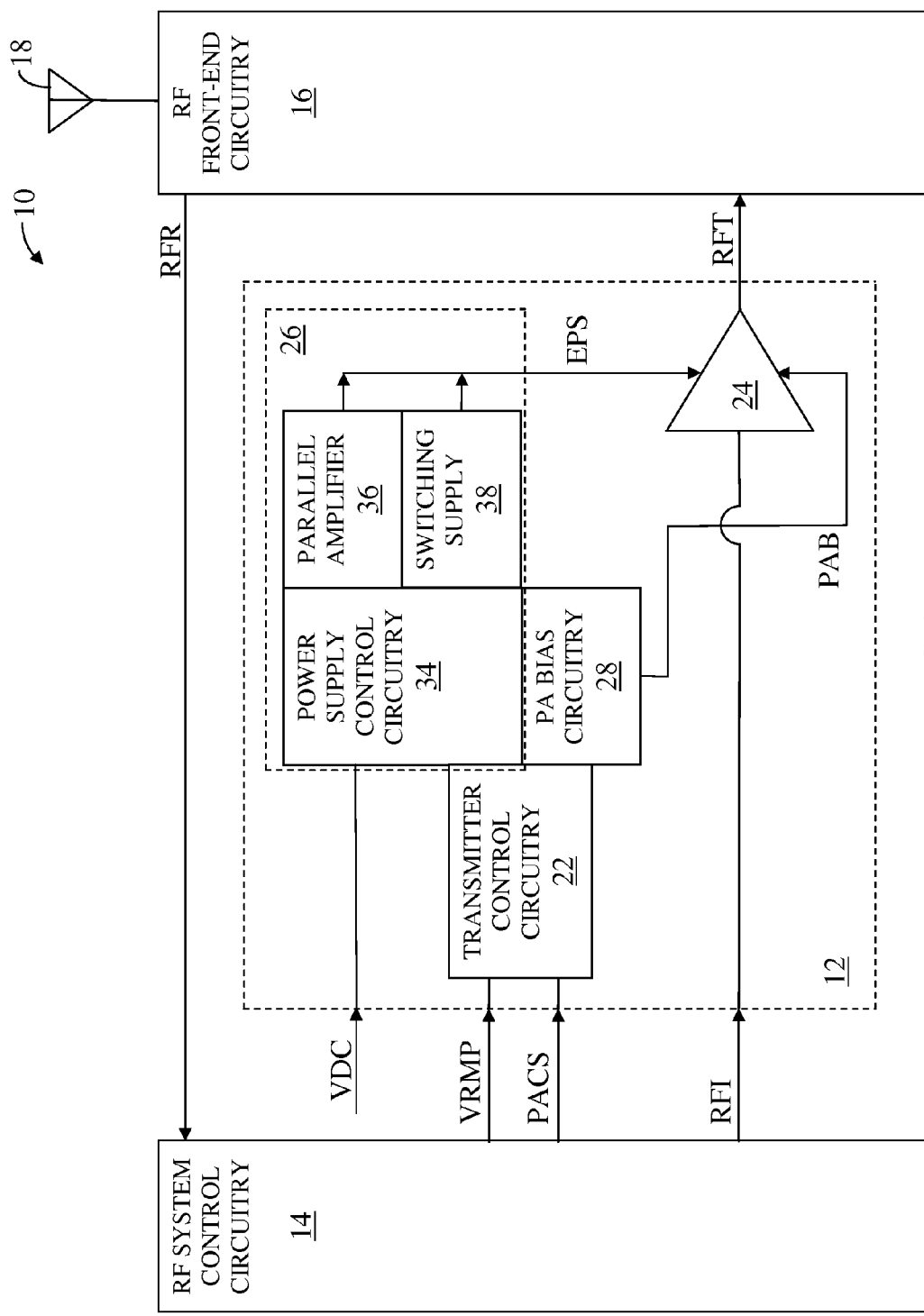
FIG. 4 shows details of an envelope tracking power supply illustrated in FIG. 1 according to one embodiment of the envelope tracking power supply.

FIG. 4 shows details of the envelope tracking power supply 26 illustrated in FIG. 1 according to one embodiment of the envelope tracking power supply 26. The envelope tracking power supply 26 includes power supply control circuitry 34, a parallel amplifier 36, and a switching supply 38. The power supply control circuitry 34 is coupled to the transmitter control circuitry 22, the parallel amplifier 36 is coupled to the power supply control circuitry 34, and the switching supply 38 is coupled to the power supply control circuitry 34. The transmitter control circuitry 22 provides the constrained setpoint of the envelope power supply voltage EPV (FIG. 1) to the power supply control circuitry 34.

The power supply control circuitry 34 controls the parallel amplifier 36 and the switching supply 38 based on the constrained setpoint of the envelope power supply voltage EPV (FIG. 1). The parallel amplifier 36 and the switching supply 38 provide the envelope power supply voltage EPV (FIG. 1), such that the parallel amplifier 36 partially provides the envelope power supply voltage EPV (FIG. 1) and the switching supply 38 partially provides the envelope power supply voltage EPV (FIG. 1). The switching supply 38 may provide power more efficiently than the parallel amplifier 36. However, the parallel amplifier 36 may provide the envelope power supply voltage EPV (FIG. 1) more accurately than the switching supply 38. As such, the parallel amplifier 36 regulates the envelope power supply voltage EPV (FIG. 1) based on the constrained setpoint of the envelope power supply voltage EPV (FIG. 1) and the switching supply 38 operates to drive an output current from the parallel amplifier 36 toward zero to increase efficiency. In this regard, the parallel amplifier 36 behaves like a voltage source and the switching supply 38 behaves like a current source.

As previously mentioned, in one embodiment of the RF communications system 10 illustrated in FIG. 1, the RF PA 24 receives and amplifies the RF input signal RFI to provide the RF transmit signal RFT using the envelope power supply voltage EPV, which provides power for amplification. As such, in a first embodiment of the envelope power supply voltage EPV, a bandwidth of the envelope power supply voltage EPV is greater than 10 megahertz. In a second embodiment of the envelope power supply voltage EPV, a bandwidth of the envelope power supply voltage EPV is greater than 20 megahertz. In a third embodiment of the envelope power supply voltage EPV, a bandwidth of the envelope power supply voltage EPV is greater than 30 megahertz. In a fourth embodiment of the envelope power supply voltage EPV, a bandwidth of the envelope power supply voltage EPV is greater than 40 megahertz. In a fifth embodiment of the envelope power supply voltage EPV, a bandwidth of the envelope power supply voltage EPV is greater than 50 megahertz. In an alternate embodiment of the envelope power supply voltage EPV, a bandwidth of the envelope power supply voltage EPV is less than 100 megahertz.

Figure 5:
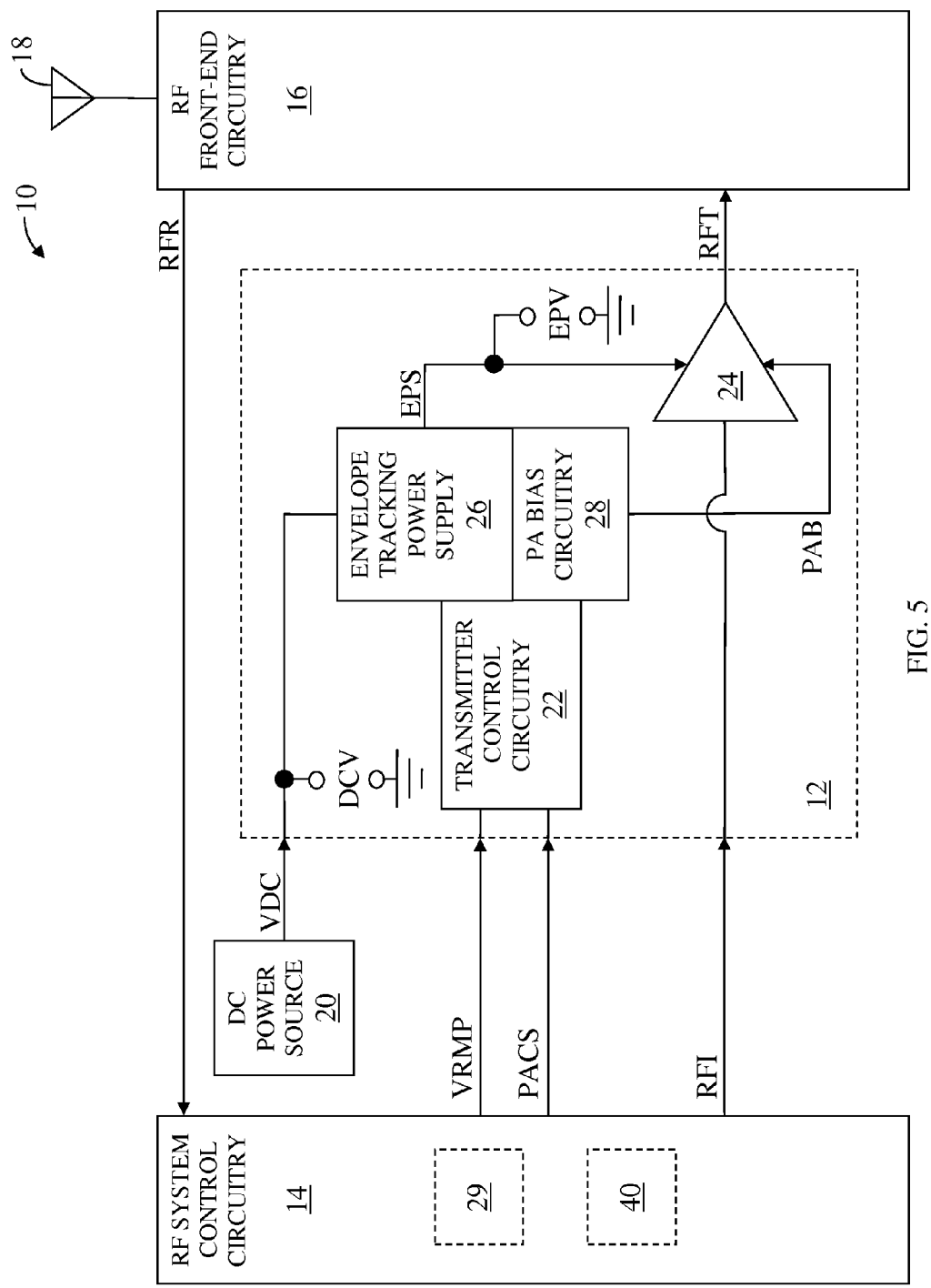
FIG. 5 shows the RF communications system according to another embodiment of the RF communications system.

FIG. 5 shows the RF communications system 10 according to another embodiment of the RF communications system 10. The RF communications system 10 illustrated in FIG. 5 is similar to the RF communications system 10 illustrated in FIG. 1, except in the RF communications system 10 illustrated in FIG. 5, the RF system control circuitry 14 includes look-up table (LUT)-based constrained setpoint data 40, which may be used by the RF system control circuitry 14 to provide the constrained setpoint. As such, the constrained setpoint is based on the LUT-based constrained setpoint data 40. Further, the RF system control circuitry 14 provides the constrained setpoint to the envelope tracking power supply 26 via the envelope power supply control signal VRMP.

In one embodiment of the RF system control circuitry 14, the RF system control circuitry 14 is the RF transceiver circuitry. As such, the RF transceiver circuitry includes the LUT-based constrained setpoint data 40, which may be used by the RF transceiver circuitry to provide the constrained setpoint. As such, the constrained setpoint is based on the LUT-based constrained setpoint data 40. Further, the RF transceiver circuitry provides the constrained setpoint to the envelope tracking power supply 26 via the envelope power supply control signal VRMP.

Figure 6:
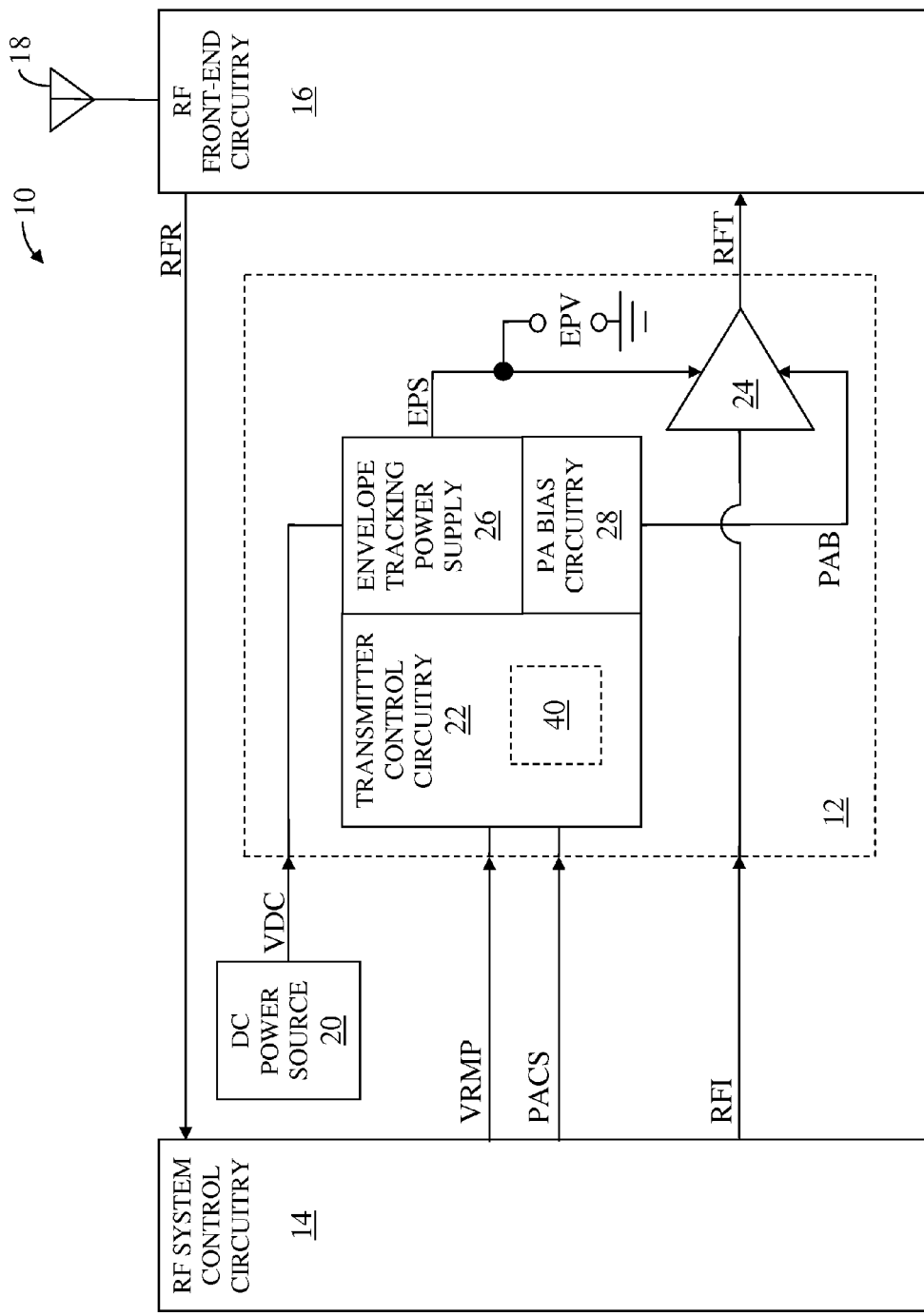
FIG. 6 shows the RF communications system according to a further embodiment of the RF communications system.

FIG. 6 shows the RF communications system 10 according to a further embodiment of the RF communications system 10. The RF communications system 10 illustrated in FIG. 6 is similar to the RF communications system 10 illustrated in FIG. 1, except in the RF communications system 10 illustrated in FIG. 6, the transmitter control circuitry 22 includes the LUT-based constrained setpoint data 40, which may be used by the transmitter control circuitry 22 to provide the constrained setpoint. As such, the constrained setpoint is based on the LUT-based constrained setpoint data 40.

Figure 7:
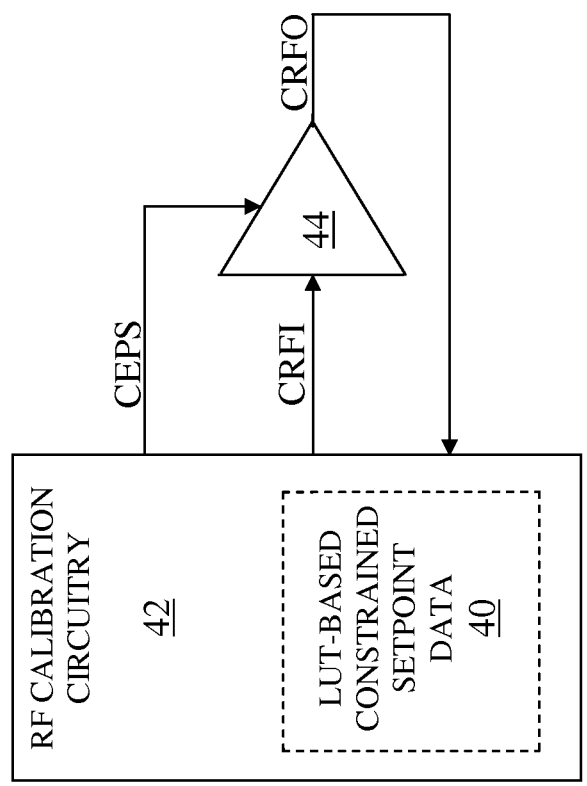
FIG. 7 shows an RF PA calibration environment according to one embodiment of the RF PA calibration environment.

FIG. 7 shows an RF PA calibration environment according to one embodiment of the RF PA calibration environment. The RF PA calibration environment includes RF calibration circuitry 42 and a calibration RF PA 44. During a calibration of the calibration RF PA 44, the RF calibration circuitry 42 provides a calibration RF input signal CRFI and a calibration envelope power supply signal CEPS to the calibration RF PA 44. The calibration RF PA 44 receives and amplifies the calibration RF input signal CRFI to provide a calibration RF output signal CRFO using the calibration envelope power supply signal CEPS to provide power for amplification. The RF calibration circuitry 42 receives the calibration RF output signal CRFO.

During the calibration of the calibration RF PA 44, the RF calibration circuitry 42 varies a magnitude of the calibration RF input signal CRFI and varies a magnitude of the calibration envelope power supply signal CEPS and measures a resulting magnitude of the calibration RF output signal CRFO. The magnitude of the calibration RF input signal CRFI is associated with an input power level and the magnitude of the calibration RF output signal CRFO is associated with an output power level. In this regard, the RF calibration circuitry 42 functionally characterizes the calibration RF PA 44 based on the magnitudes of the calibration RF input signal CRFI, the calibration envelope power supply signal CEPS, and the calibration RF output signal CRFO. Specifically, the RF calibration circuitry 42 characterizes the NCG of the calibration RF PA 44 and provides the LUT-based constrained setpoint data 40 based on the NCG characterization of the calibration RF PA 44.

In general, the LUT-based constrained setpoint data 40 is based on a functional characterization of the calibration RF PA 44. In one embodiment of the RF PA calibration environment, the RF PA calibration environment is external to the RF communications system 10 (FIGS. 5 and 6). In an alternate embodiment of the RF PA calibration environment, the RF PA calibration environment includes the RF communications system 10 (FIGS. 5 and 6). In another embodiment of the RF PA calibration environment, the RF system control circuitry 14 (FIG. 5) provides the RF PA calibration environment, such that the calibration RF PA 44 is the RF PA 24 (FIG. 5). In general, in one embodiment of the calibration RF PA 44, the calibration RF PA 44 is the RF PA 24 (FIGS. 5 and 6). In an alternate embodiment of the calibration RF PA 44, the calibration RF PA 44 is not the RF PA 24 (FIGS. 5 and 6).

Figure 8:
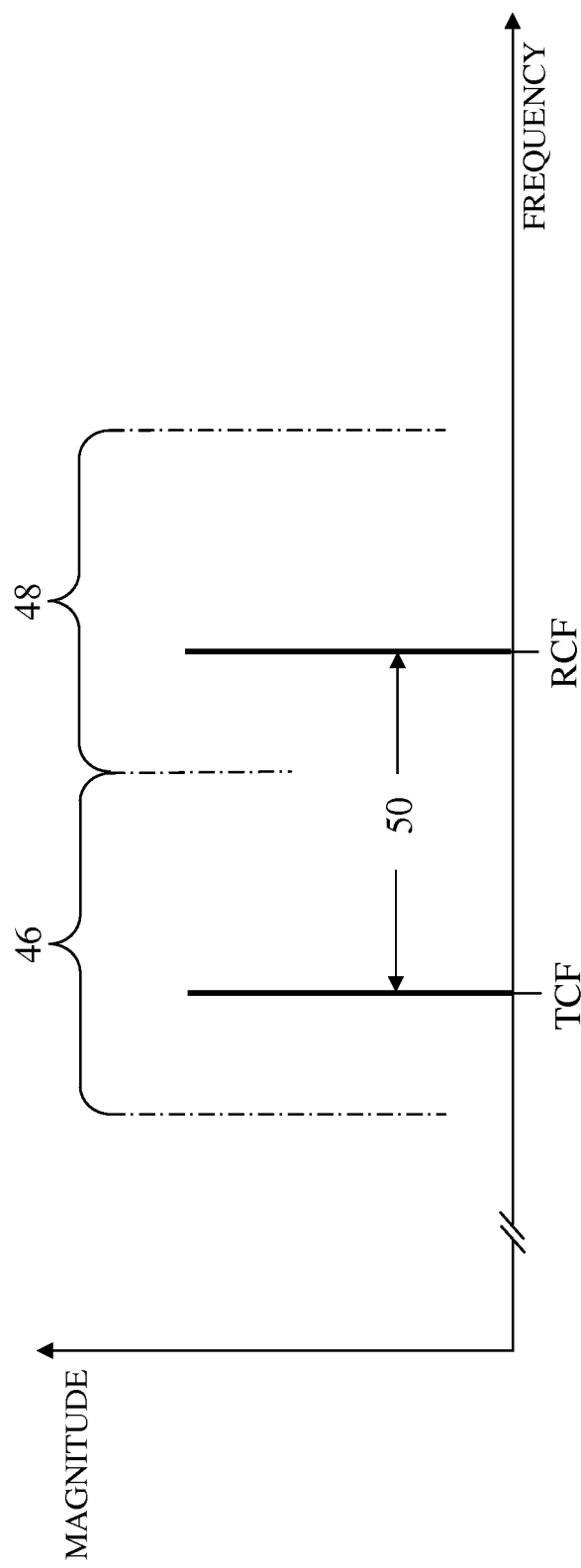
FIG. 8 is a graph illustrating an RF transmit band associated with an RF transmit signal and an RF receive band associated with an RF receive signal illustrated in FIG. 1 according to one embodiment of the RF communications system.

FIG. 8 is a graph illustrating an RF transmit band 46 associated with the RF transmit signal RFT and an RF receive band 48 associated with the RF receive signal RFR illustrated in FIG. 1 according to one embodiment of the RF communications system 10. The RF transmit signal RFT (FIG. 1) has a transmit carrier frequency TCF and the RF receive signal RFR (FIG. 1) has a receive carrier frequency RCF. An RF duplex frequency 50 is based on a difference between the transmit carrier frequency TCF and the receive carrier frequency RCF.

Figure 9:
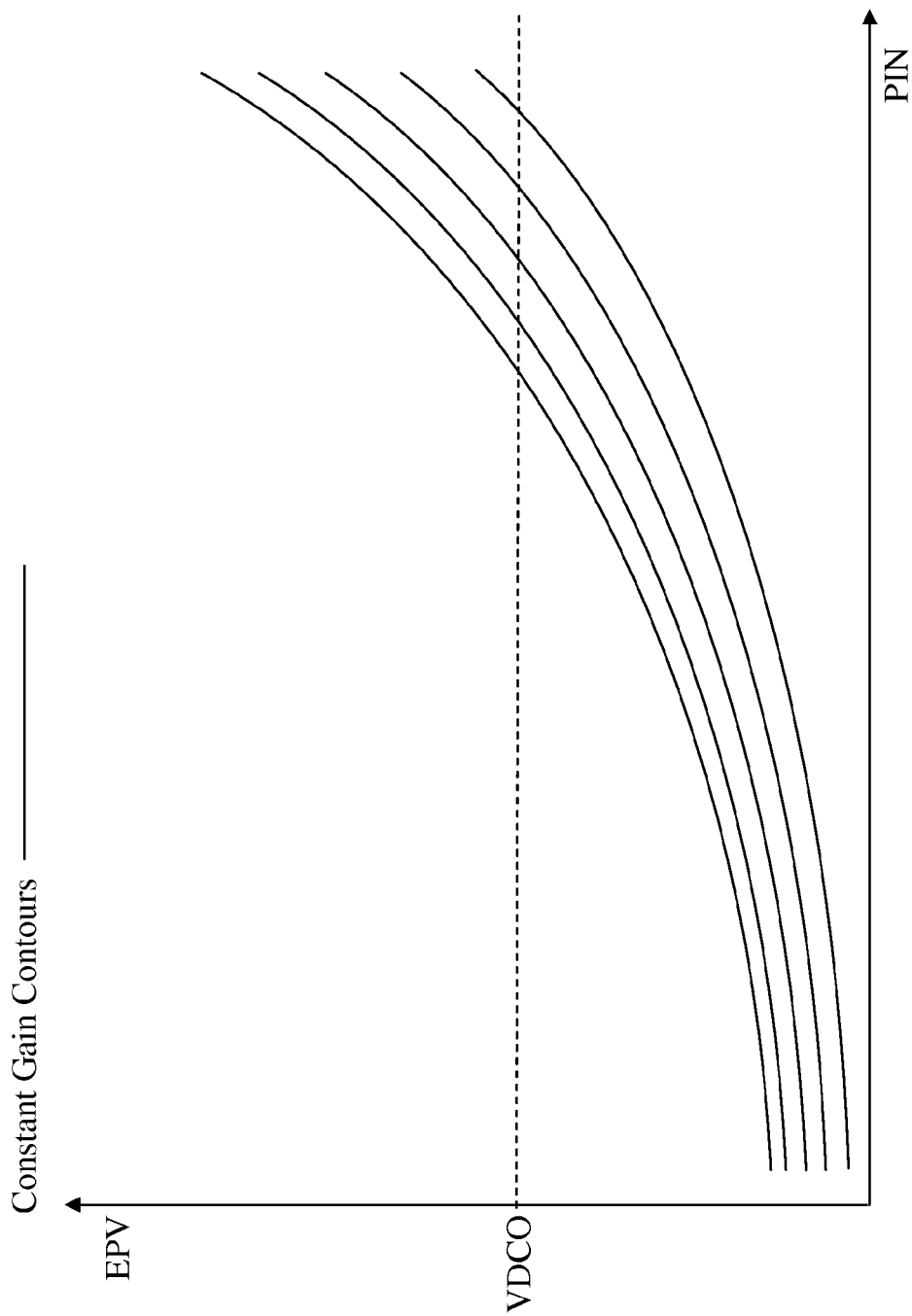
FIG. 9 is a graph illustrating a relationship between the envelope power supply voltage and an input power to an RF PA illustrated in FIG. 1 according to one embodiment of the RF communications system.

FIG. 9 is a graph illustrating a relationship between the envelope power supply voltage EPV and an input power PIN to the RF PA 24 illustrated in FIG. 1 according to one embodiment of the RF communications system 10. The embodiments illustrated in FIGS. 9, 10, 11, and 12 are exemplary and make no general restrictions regarding a relationship between the input power PIN, the envelope power supply voltage EPV, and NCG other than the concept that NCG may be used as a constraint, which may be used to put some type(s) of noise under control. In this regard, both FIG. 1 and FIG. 9 may be relevant to the information presented below. Further, FIG. 9 illustrates a DC operating point VDCO. A voltage gain VGAIN of the RF PA 24 is defined as a magnitude of an output voltage VOUT of the RF transmit signal RFT divided by a magnitude of an input voltage VIN of the RF input signal RFI, as shown in EQ. 1 below.

$$\text{VGAIN}=\text{VOUT/VIN, or VOUT}=\text{VGAIN}*\text{VIN}. \qquad \text{EQ. 1:}$$

When the RF PA 24 operates in a non-saturated manner, the envelope power supply voltage EPV is high enough to provide operating headroom. As such, within a preferred operating range of the RF PA 24, the voltage gain VGAIN does not significantly change due to changes in the envelope power supply voltage EPV. However, providing the operating headroom may decrease efficiency of the RF PA 24. As a result, envelope tracking is often used to decrease the operating headroom and increase efficiency. Further, in one embodiment of the RF PA 24, the RF PA 24 operates with at least partial saturation to increase efficiency. When operating with partial saturation, the envelope power supply voltage EPV is not high enough to allow completely linear operation of the RF PA 24. As a result, the voltage gain VGAIN is reduced.

In this regard, FIG. 9 shows Constant Gain Contours of the RF PA 24. Each Constant Gain Contour represents a constant voltage gain VGAIN of the RF PA 24. As such, for each Constant Gain Contour, as the input power PIN increases, the envelope power supply voltage EPV also increases to maintain the constant voltage gain VGAIN at the saturation level associated with the Constant Gain Contour. As a result, different saturation levels of the RF PA 24 are associated with different Constant Gain Contours, such that each Constant Gain Contour is associated with a respective saturation level. As the RF PA 24 is operated into deeper levels of saturation, the envelope power supply voltage EPV levels needed to maintain the constant voltage gain VGAIN are reduced. Therefore, the Constant Gain Contours with higher envelope power supply voltage EPV levels illustrated in FIG. 9 are associated with lower saturation levels than the Constant Gain Contours with lower envelope power supply voltage EPV levels.

Once an Constant Gain Contour is selected, the voltage gain VGAIN may be linearized around the DC operating point VDCO, as shown in EQ. 2 below.

$$\text{VGAIN}=\text{VGAIN(at VDCO)}+[(d\text{VGAIN}/d\text{EPV})*\\(\text{EPV-VDCO})]. \qquad \text{EQ. 2:}$$

In general, when operating the RF PA 24 in partial saturation, the voltage gain VGAIN is dependent on both the input power PIN and the envelope power supply voltage EPV. As such, noise in the envelope power supply voltage EPV, such as switching noise from the switching supply 38, modulates the voltage gain VGAIN, thereby introducing noise in the RF transmit signal RFT. As saturation levels increase, efficiency of the RF PA 24 may increase, but the resulting noise in the RF transmit signal RFT also increases. Therefore, there is a tradeoff between efficiency of the RF PA 24 and noise in the RF transmit signal RFT. Noise in the RF transmit signal RFT may be problematic in meeting RF transmit spectrum requirements, in meeting Adjacent Channel Leakage Ratio (ACLR) requirements, in meeting communications protocol requirements, by interfering with RF receive operations, the like, or any combination thereof.

As previously mentioned, the NCG of the RF PA 24 is a metric of how the RF PA 24 converts noise in the envelope power supply voltage EPV to noise in the RF transmit signal RFT. As such, the NCG is a function of both the input power PIN and the envelope power supply voltage EPV.

In one embodiment of the RF PA 24, the conversion of the noise in the envelope power supply voltage EPV to the noise in the RF transmit signal RFT is at least partially as a result of the partial saturation of the RF PA 24. Further, in one embodiment of the RF PA 24, the conversion of the noise in the envelope power supply voltage EPV to the noise in the RF transmit signal RFT is at least partially as a result of the physics of the semiconductor device that provides the RF PA 24.

When the RF PA 24 operates in partial saturation, the RF PA 24 partially functions as an RF mixer, which mixes the envelope power supply voltage EPV and the RF input signal RFI, which has the input voltage VIN. Therefore, for purposes of illustration, the noise in the envelope power supply voltage EPV is represented as a continuous wave (CW) having a noise amplitude NA and a noise frequency NF, and the RF input signal RFI is represented as a CW having an input amplitude RFA and an input frequency RFF, as shown in EQ. 3 and EQ. 4, respectively below.

$$EPV = VDCO + (NA)\sin[2\pi(NF)t]. \quad \text{EQ. 3:}$$

$$VIN = (RFA)\sin[2\pi(RFF)t]. \quad \text{EQ. 4:}$$

Substituting EQ. 4 into EQ. 1 provides EQ. 5, as shown below.

$$VOUT = VGAIN*VIN = VGAIN*[(RFA)\sin[2\pi(RFF)t]. \quad \text{EQ. 5:}$$

EQ. 2 may be re-arranged into EQ. 6, EQ. 7, and EQ. 8, as shown below.

$$VGAIN = (\text{Part 1}) + (\text{Part 2}). \quad \text{EQ. 6:}$$

$$\text{Part 1} = VGAIN(\text{at } VDCO). \quad \text{EQ. 7:}$$

$$\text{Part 2} = [(dVGAIN/dEPV)*(EPV - VDCO)]. \quad \text{EQ. 8:}$$

Substituting EQ. 3 into EQ. 8 provides EQ. 9, as shown below.

$$\text{Part 2} = [dVGAIN/dEPV][VDCO + (NA)\sin 2\pi(NF)t - VDCO]. \quad \text{EQ. 9:}$$
$$= [(dVGAIN/dEPV)*(NA)\sin 2\pi(NF)t].$$

Substituting EQ. 6 into EQ. 5 provides EQ. 10, as shown below.

$$VOUT = (\text{Part } A \text{ of } VOUT) + (\text{Part } B \text{ of } VOUT). \quad \text{EQ. 10:}$$
$$= [(\text{Part 1}) + (\text{Part 2})] * [(RFA)\sin[2\pi(RFF)t].$$

EQ. 10 is separated into EQ. 11 and EQ. 12, as shown below.

$$\text{Part } A \text{ of } VOUT = (\text{Part 1}) * [(RFA)\sin[2\pi(RFF)t]. \quad \text{EQ. 11:}$$
$$= [VGAIN(\text{at } VDCO)] * [(RFA)\sin[2\pi(RFF)t].$$

$$\text{Part } B \text{ of } VOUT = (\text{Part 2}) * [(RFA)\sin[2\pi(RFF)t]. \quad \text{EQ. 12:}$$
$$= [(dVGAIN/dEPV)] * [(NA)\sin 2\pi(NF)t] * [(RFA)\sin[2\pi(RFF)t].$$

Part A of VOUT, as shown in EQ. 11, includes only an RF frequency RFF term and does not contain any Noise Frequency NF terms. As such, EQ. 11 is indicative of no contribution to the NCG of the RF PA 24 illustrated in FIG. 1. Therefore, Part A of VOUT is ignored. However, Part B of VOUT, as shown in EQ. 12, includes both an RF frequency RFF term and a Noise Frequency NF term. As such, EQ. 12 is indicative of contribution to the NCG of the RF PA 24 illustrated in FIG. 1.

A product trigonometric identity is provided in EQ. 13, as shown below.

$$(\sin A)(\sin B) = [\cos(A-B) - \cos(A+B)]/2. \quad \text{EQ. 13:}$$

Combining EQ. 12 into EQ. 13 provides EQ. 14, as shown below.

$$\text{Part } B \text{ of } VOUT = [(dVGAIN/dEPV)] * (RFA) * (NA) * [\cos 2\pi(RFF-NF)t - \cos 2\pi(RFF-NF)t]/2. \quad \text{EQ. 14:}$$

From EQ. 14, the RF transmit signal RFT includes noise from the envelope power supply voltage EPV at both a sum of and a difference between the input frequency RFF and the noise frequency NF. In an exemplary embodiment of the NCG, the NCG is related to a ratio of power of the noise from the envelope power supply voltage EPV in the RF transmit signal RFT divided by the power of the noise in the envelope power supply voltage EPV. For example, in a first exemplary embodiment of the NCG, the NCG is related to the noise from the envelope power supply voltage EPV in the RF transmit signal RFT at the difference between the input frequency RFF and the noise frequency NF. In a second exemplary embodiment of the NCG, the NCG is related to the noise from the envelope power supply voltage EPV in the RF transmit signal RFT at the sum of the input frequency RFF and the noise frequency NF.

In one embodiment of the RF communications system 10, the RF transmit signal RFT has the transmit carrier frequency TCF (FIG. 8) and the noise frequency NF is about equal to the RF duplex frequency 50 (FIG. 8). As such, a sum of the input frequency RFF and the noise frequency NF may be about equal to the receive carrier frequency RCF (FIG. 8). As a result, since a magnitude of the RF receive signal RFR may be much smaller than a magnitude of the RF transmit signal RFT, the noise from the envelope power supply voltage EPV in the RF transmit signal RFT may interfere with proper reception of the RF receive signal RFR. Therefore, the NCG and the target NCG may be based on the noise from the envelope power supply voltage EPV in the RF transmit signal RFT at the sum of the input frequency RFF and the noise frequency NF.

In the embodiment of the RF communications system 10 just presented, the noise in the envelope power supply voltage EPV was represented as a continuous wave (CW). However, the noise in the envelope power supply voltage EPV introduced from the switching supply 38 may have multiple harmonics of a fundamental switching frequency. As a result, the NCG, the target NCG, or both may be based on noise at any or all of the harmonics of the fundamental switching frequency.

Figure 10:
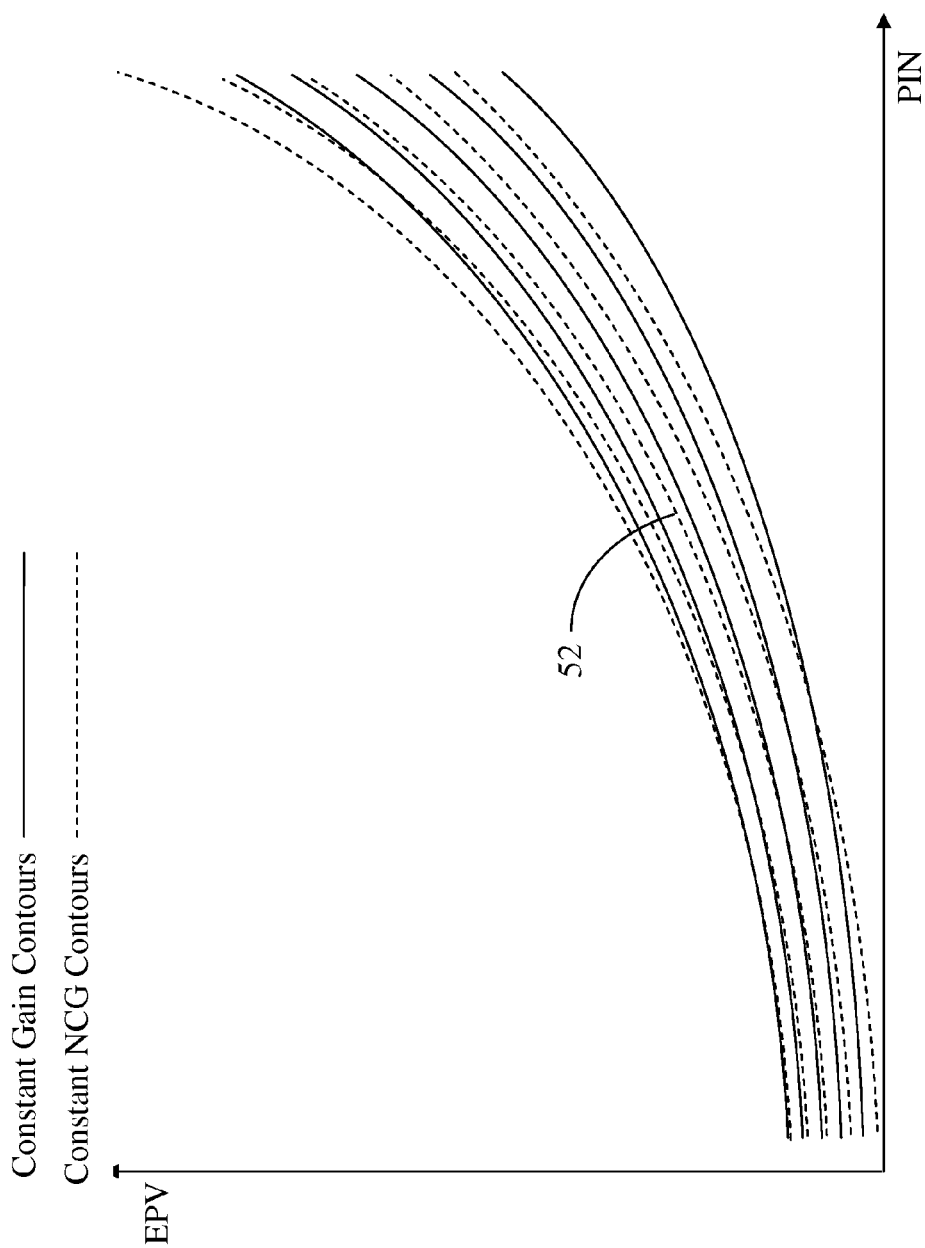
FIG. 10 is a graph illustrating a relationship between the envelope power supply voltage and the input power to the RF PA illustrated in FIG. 1 according to an alternate embodiment of the RF communications system.

FIG. 10 is a graph illustrating a relationship between the envelope power supply voltage EPV and the input power PIN to the RF PA 24 illustrated in FIG. 1 according to an alternate embodiment of the RF communications system 10. The graph illustrated in FIG. 10 is similar to the graph illustrated in FIG. 9, except the graph illustrated in FIG. 10 includes the Constant Gain Contours illustrated in FIG. 9 and further includes Constant NCG Contours. Each Constant NCG Contour represents a constant NCG of the RF PA 24. As such, for each Constant NCG Contour, as the input power PIN increases, the envelope power supply voltage EPV also increases to maintain a constant NCG. As a result, different NCGs of the RF PA 24 are associated with different Constant NCG Contours, such that each Constant NCG Contour is associated with a respective NCG. As previously mentioned, as the RF PA 24 is operated into deeper levels of saturation, the envelope power supply voltage EPV levels needed to maintain the constant voltage gain VGAIN are reduced. However, the deeper levels of saturation tend to increase the NCG. Therefore, the Constant NCG Contours with higher envelope power supply voltage EPV levels illustrated in FIG. 10 are associated with lower NCGs than the Constant NCG Contours with lower envelope power supply voltage EPV levels.

In one embodiment of the RF communications system 10, one of the Constant NCG Contours is a Target Constant NCG Contour 52, which is associated with the target NCG. In one embodiment of the RF communications system 10, the NCG of the RF PA 24 is equal to the target NCG when an output power from the RF PA 24 is about equal to a target output power from the RF PA 24. In one embodiment of the target output power, the target output power is a rated average output power of the RF PA 24 during envelope tracking. In an alternate embodiment of the target output power, the target output power is a maximum of a rated range of average output power of the RF PA 24 during envelope tracking.

Figure 11:
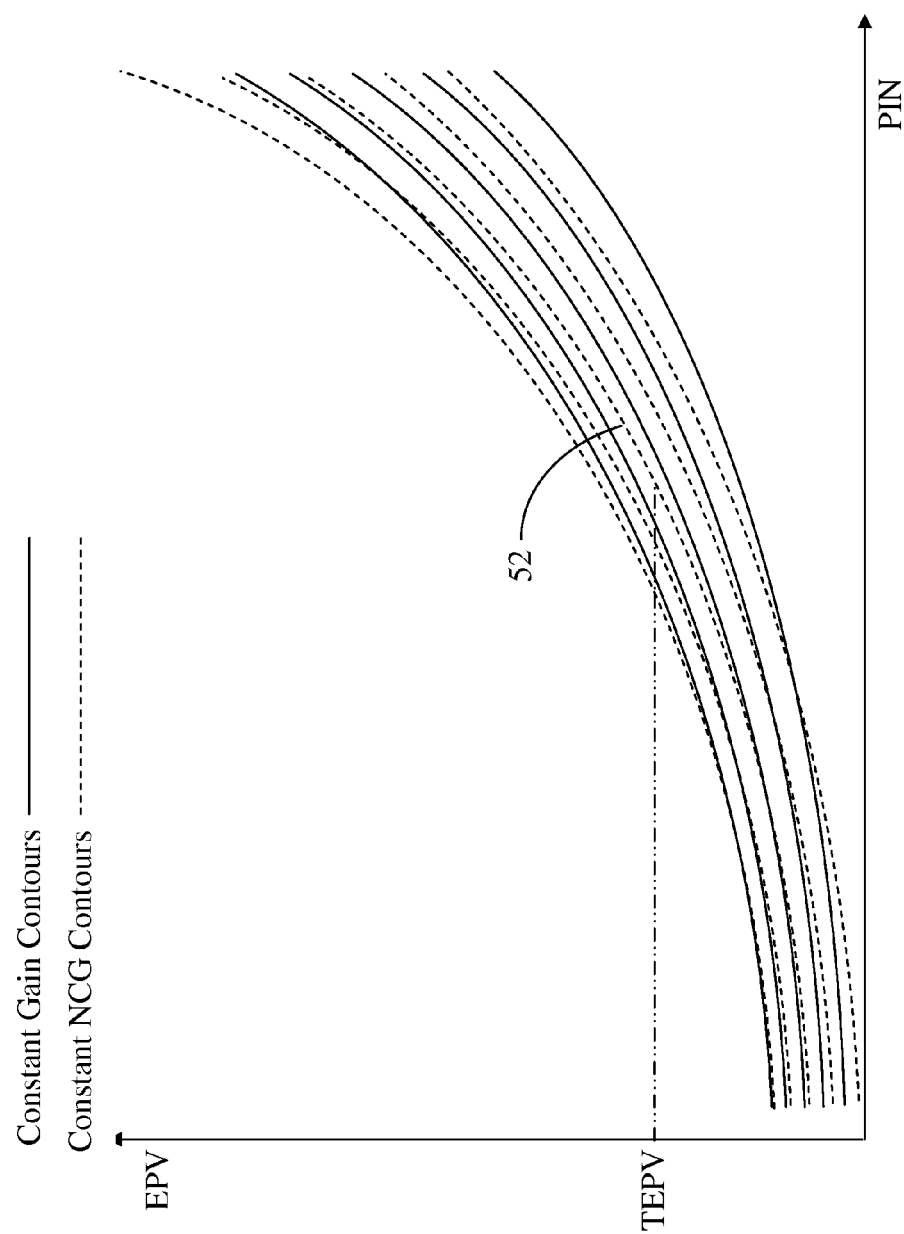
FIG. 11 is a graph illustrating a relationship between the envelope power supply voltage and the input power to the RF PA illustrated in FIG. 1 according to an additional embodiment of the RF communications system.

FIG. 11 is a graph illustrating a relationship between the envelope power supply voltage EPV and the input power PIN to the RF PA 24 illustrated in FIG. 1 according to an additional embodiment of the RF communications system 10. The graph illustrated in FIG. 11 is similar to the graph illustrated in FIG. 10, except the graph illustrated in FIG. 11 further shows a target envelope power supply voltage TEPV. As such, in one embodiment of the RF communications system 10, the NCG of the RF PA 24 is equal to the target NCG when the envelope power supply voltage EPV is about equal to the target envelope power supply voltage TEPV.

Figure 12:
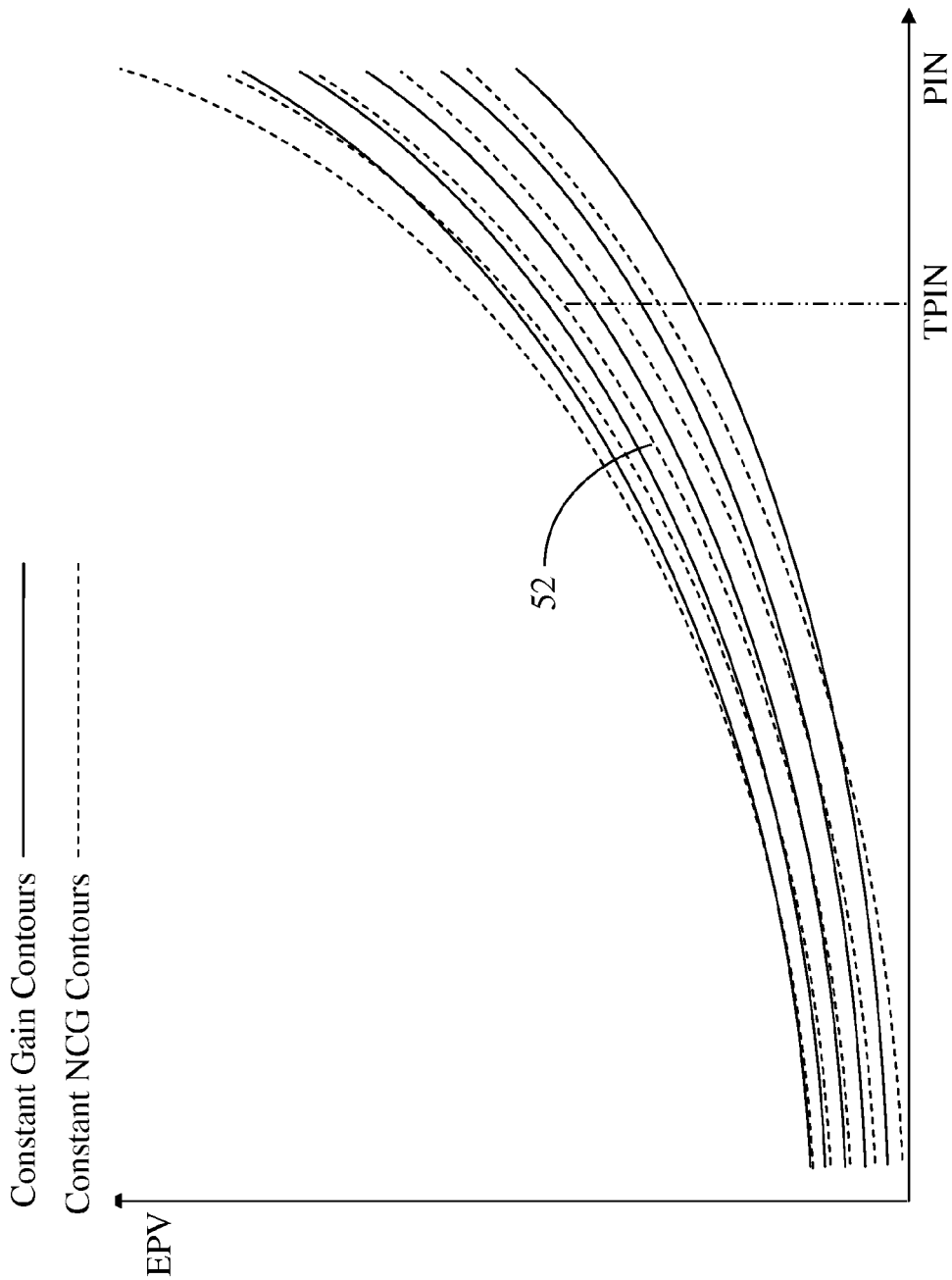
FIG. 12 is a graph illustrating a relationship between the envelope power supply voltage and the input power to the RF PA illustrated in FIG. 1 according to another embodiment of the RF communications system.

FIG. 12 is a graph illustrating a relationship between the envelope power supply voltage EPV and the input power PIN to the RF PA 24 illustrated in FIG. 1 according to another embodiment of the RF communications system 10. The graph illustrated in FIG. 12 is similar to the graph illustrated in FIG. 10, except the graph illustrated in FIG. 12 further shows a target input power TPIN. As such, in one embodiment of the RF communications system 10, the NCG of the RF PA 24 is equal to the target NCG when the input power PIN is about equal to the target input power TPIN.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   envelope control circuitry configured to provide an envelope power supply control signal; and
   a radio frequency (RF) modulator configured to provide an RF input signal, wherein:
   an RF power amplifier (PA) is configured to receive and amplify the RF input signal to provide an RF transmit signal using an envelope power supply voltage;
   an envelope tracking power supply is configured to provide the envelope power supply voltage based on a setpoint, which has been constrained to limit a noise conversion gain (NCG) of the RF PA to not exceed a target NCG, wherein the envelope power supply voltage at least partially tracks an envelope of the RF transmit signal; and
   RF transceiver circuitry comprises the envelope control circuitry and the RF modulator, such that the setpoint, which has been constrained to limit the NCG of the RF PA, is a constrained setpoint, such that the RF transceiver circuitry is configured to provide the constrained setpoint to the envelope tracking power supply via the envelope power supply control signal.

2. The circuitry of claim 1 wherein the RF transceiver circuitry comprises look-up table-based constrained setpoint data, such that the constrained setpoint is based on the look-up table-based constrained setpoint data.

3. The circuitry of claim 2 wherein the look-up table-based constrained setpoint data is based on a functional characterization of a calibration RF PA.

4. The circuitry of claim 3 wherein the calibration RF PA is the RF PA.

5. The circuitry of claim 1 wherein the RF transceiver circuitry is further configured to provide the envelope power supply control signal to the envelope tracking power supply via a digital communications bus and a digital communications interface.

6. The circuitry of claim 1 wherein the RF transceiver circuitry is further configured to pre-distort the constrained setpoint to increase linearity of the RF PA.

7. The circuitry of claim 1 wherein the RF transceiver circuitry is further configured to pre-distort the constrained setpoint to decrease intermodulation distortion of the RF PA.

8. The circuitry of claim 1 wherein the RF transceiver circuitry is further configured to pre-distort the constrained setpoint to maintain approximately constant voltage gain of the RF PA.

9. Circuitry comprising:
   a radio frequency (RF) power amplifier (PA) configured to receive and amplify an RF input signal to provide an RF transmit signal using an envelope power supply voltage; and
   an envelope tracking power supply configured to provide the envelope power supply voltage based on a setpoint, which has been constrained to limit a noise conversion gain (NCG) of the RF PA to not exceed a target NCG, wherein the envelope power supply voltage at least partially tracks an envelope of the RF transmit signal.

10. The circuitry of claim 9 wherein the envelope tracking power supply comprises a parallel amplifier and a switching supply, such that:
   the parallel amplifier is configured to partially provide and regulate the envelope power supply voltage based on the setpoint; and the switching supply is configured to partially provide the envelope power supply voltage and drive an output current from the parallel amplifier toward zero.

11. The circuitry of claim 9 wherein the setpoint, which has been constrained to limit the NCG of the RF PA, is a constrained setpoint, and the circuitry further comprises transmitter control circuitry configured to constrain an unconstrained setpoint of the envelope power supply voltage to provide the constrained setpoint to the envelope tracking power supply.

12. The circuitry of claim 11 wherein the transmitter control circuitry comprises look-up table-based constrained setpoint data, such that the constrained setpoint is based on the look-up table-based constrained setpoint data.

13. The circuitry of claim 12 wherein the look-up table-based constrained setpoint data is based on a functional characterization of a calibration RF PA.

14. The circuitry of claim 13 wherein the calibration RF PA is the RF PA.

15. The circuitry of claim 11 wherein RF system control circuitry is configured to provide the unconstrained setpoint of the envelope power supply voltage to the transmitter control circuitry via an envelope power supply control signal.

16. The circuitry of claim 15 further comprising the RF system control circuitry.

17. The circuitry of claim 11 wherein the transmitter control circuitry is further configured to pre-distort the constrained setpoint to increase linearity of the RF PA.

18. The circuitry of claim 11 wherein the transmitter control circuitry is further configured to pre-distort the constrained setpoint to decrease intermodulation distortion of the RF PA.

19. The circuitry of claim 11 wherein the transmitter control circuitry is further configured to pre-distort the constrained setpoint to maintain approximately constant voltage gain of the RF PA.

20. The circuitry of claim 9 wherein the NCG of the RF PA is equal to the target NCG when an input power to the RF PA is about equal to a target input power.

21. The circuitry of claim 9 wherein the NCG of the RF PA is equal to the target NCG when the envelope power supply voltage is about equal to a target envelope power supply voltage.

22. The circuitry of claim 9 wherein the NCG of the RF PA is equal to the target NCG when an output power from the RF PA is about equal to a target output power.

23. The circuitry of claim 22 wherein the target output power is a rated average output power of the RF PA during envelope tracking.

24. The circuitry of claim 22 wherein the target output power is a maximum of a rated range of average output power of the RF PA during envelope tracking.

25. The circuitry of claim 9 wherein a bandwidth of the envelope power supply voltage is greater than 20 megahertz.

26. A method comprising:
receiving and amplifying a radio frequency (RF) input signal to provide an RF transmit signal using an envelope power supply voltage; and
providing the envelope power supply voltage based on a setpoint, which has been constrained to limit a noise conversion gain (NCG) of an RF power amplifier (PA) to not exceed a target NCG, wherein the envelope power supply voltage at least partially tracks an envelope of the RF transmit signal.

* * * * *